(12) United States Patent
Katou et al.

(10) Patent No.: US 11,293,626 B2
(45) Date of Patent: Apr. 5, 2022

(54) LIGHT EMITTING COMPONENT MOUNTING METHOD

(71) Applicant: Panasonic Intellectual Property Management Co., Ltd., Osaka (JP)

(72) Inventors: Hideaki Katou, Fukuoka (JP); Koji Sakurai, Fukuoka (JP); Masanori Ikeda, Tokyo (JP); Naoki Azuma, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 405 days.

(21) Appl. No.: 16/247,748

(22) Filed: Jan. 15, 2019

(65) Prior Publication Data

US 2019/0242558 A1 Aug. 8, 2019

(30) Foreign Application Priority Data

Feb. 7, 2018 (JP) .............................. JP2018-019714

(51) Int. Cl.

| | |
|---|---|
| *F21V 19/00* | (2006.01) |
| *H05K 13/04* | (2006.01) |
| *H05K 13/08* | (2006.01) |
| *F21V 14/02* | (2006.01) |
| *G01D 5/26* | (2006.01) |
| *H01L 25/075* | (2006.01) |
| *H01L 27/15* | (2006.01) |

(Continued)

(52) U.S. Cl.
CPC .......... *F21V 19/0025* (2013.01); *F21V 14/02* (2013.01); *G01D 5/26* (2013.01); *H01L 25/0753* (2013.01); *H01L 27/156* (2013.01); *H01L 33/005* (2013.01); *H05K 13/0015* (2013.01); *H05K 13/0413* (2013.01); *H05K 13/0813* (2018.08)

(58) Field of Classification Search
CPC ........... H05K 13/0413; H05K 13/0813; H05K 13/0015; H05K 13/0408; H05K 13/08; F21V 19/0025; F21V 14/02; G01D 5/26; H01L 25/0753; H01L 27/156; H01L 33/00; H01L 33/005
See application file for complete search history.

(56) References Cited

U.S. PATENT DOCUMENTS

| | | | |
|---|---|---|---|
| 6,208,419 B1 | 3/2001 | Yamamoto et al. | |
| 7,967,652 B2 * | 6/2011 | Emerson | ............. H01L 25/0753 445/24 |

(Continued)

FOREIGN PATENT DOCUMENTS

| | | | | |
|---|---|---|---|---|
| EP | 1003212 A2 * | 5/2000 | ............. | H05K 3/303 |
| JP | H08-018164 A | 1/1996 | | |

(Continued)

*Primary Examiner* — Jeffrey T Carley
(74) *Attorney, Agent, or Firm* — Pearne & Gordon LLP

(57) ABSTRACT

A light emitting component mounting method for holding a light emitting component with a light emitter by a mounting head and mounting the light emitting component on a board is provided. The method includes energizing the light emitter to emit a light, measuring a luminance distribution of the light emitter and detecting a position of a luminance distribution center in the light emitter based on the measured luminance distribution.

1 Claim, 9 Drawing Sheets

(51) Int. Cl.
 *H01L 33/00* (2010.01)
 *H05K 13/00* (2006.01)

(56) References Cited

U.S. PATENT DOCUMENTS

| | | | |
|---|---|---|---|
| 2004/0246367 A1* | 12/2004 | Yoshida | G01B 11/24 |
| | | | 348/370 |
| 2012/0257043 A1* | 10/2012 | Tsuboi | H05K 13/0812 |
| | | | 348/86 |
| 2013/0169793 A1* | 7/2013 | Hayashi | G01N 21/896 |
| | | | 348/125 |
| 2015/0176779 A1 | 6/2015 | Azuma et al. | |
| 2015/0355053 A1 | 12/2015 | Ji et al. | |
| 2016/0081243 A1 | 3/2016 | Azuma et al. | |
| 2020/0077551 A1* | 3/2020 | Okamoto | H05K 13/0813 |

FOREIGN PATENT DOCUMENTS

| | | | |
|---|---|---|---|
| JP | 2000-286452 A | 10/2000 | |
| JP | 2015-119134 A | 6/2015 | |
| JP | 2015-233121 A | 12/2015 | |
| JP | 2017-139388 A | 8/2017 | |
| WO | WO-2004016064 A1 * | 2/2004 | H05K 13/0409 |

\* cited by examiner

ARROW A-A

ARROW B-B

LIGHT EMITTING COMPONENT MOUNTING METHOD

BACKGROUND

1. Technical Field

The present disclosure relates to a light emitting component mounter and a light emitting component mounting method for mounting light emitting components such as LEDs on a board.

2. Description of the Related Art

In recent years, an illumination board in the form of mounting a light emitting component such as an LED on a board as a lighting device is widely used. Since an amount of light emitted by a single light emitting component is small, in general, an illumination board is used, having a configuration in which optical arrays, including a number of light emitting components mounted thereon and a plurality of condensing elements integrally molded on the component mounting surface, are arranged. Since the LED is characterized by the strong directivity of the emitted light, in order to increase the light utilization efficiency in the illumination board of such a configuration, it is desirable to align an optical axis of the light emitting component with an optical axis of the condensing element as much as possible.

However, a center of the light emission that corresponds to the optical axis of the light emitter in the light emitting components is deviated due to various error factors in the manufacturing process. For the purpose of solving the problem caused due to the deviation of the light emitting center as much as possible, it is proposed to optically recognize the position of the light emitter prior to mounting the light emitting component (for example, Japanese Patent Unexamined Publication No. 2015-119134). In the related art shown in this patent document, it is described that the positional deviation of the light emitter in the light emitting element is detected together with the position of the light emitting element, and the light emitting element is shifted by the positional deviation to align the light emitting element when mounting the light emitting element.

SUMMARY

However, in the patent document example described above, since the light emitting element is mounted with the center of the detected light emitter serving as the reference position, there is no guarantee that the light emitting center is properly aligned with the condensing element, and the problem mentioned above remains unresolved. Therefore, a method is desired, which is capable of correctly detecting a center of light emission and aligning the same on a board.

Accordingly, it is an object of the present disclosure to provide a light emitting component mounter and a light emitting component mounting method, which may correctly detect the center of light emission of a light emitting component and align the same on a board.

A light emitting component mounter according to the present disclosure holds a light emitting component provided with a light emitter by a mounting head and mounts the light emitting component on a board, and the light emitting component mounter includes a luminance distribution measurer, a head moving mechanism, and a component mounting processor. The luminance distribution measurer causes the light emitter to emit a light and measures a luminance distribution of the light emitter, and detects a position of a luminance distribution center in the light emitter based on the measured luminance distribution. The head moving mechanism moves the mounting head. The component mounting processor controls the head moving mechanism based on the position detected by the luminance distribution measurer.

A light emitting component mounting method for holding a light emitting component provided with a light emitter by a mounting head and mounting the light emitting component on a board according to the present disclosure includes luminance distribution measuring and head moving. Luminance distribution measuring includes causing the light emitter to emit a light and measuring a luminance distribution of the light emitter, and detecting a position of the luminance distribution center in the light emitter based on the luminance distribution measured in the measuring Head moving includes moving the mounting head holding the light emitting component. Head moving includes moving the mounting head based on the position detected in the detecting.

According to the present disclosure, it is possible to correctly detect the light emitting center of a light emitting component and align the light emitting center on the board.

DETAILED DESCRIPTION

Figure 1:
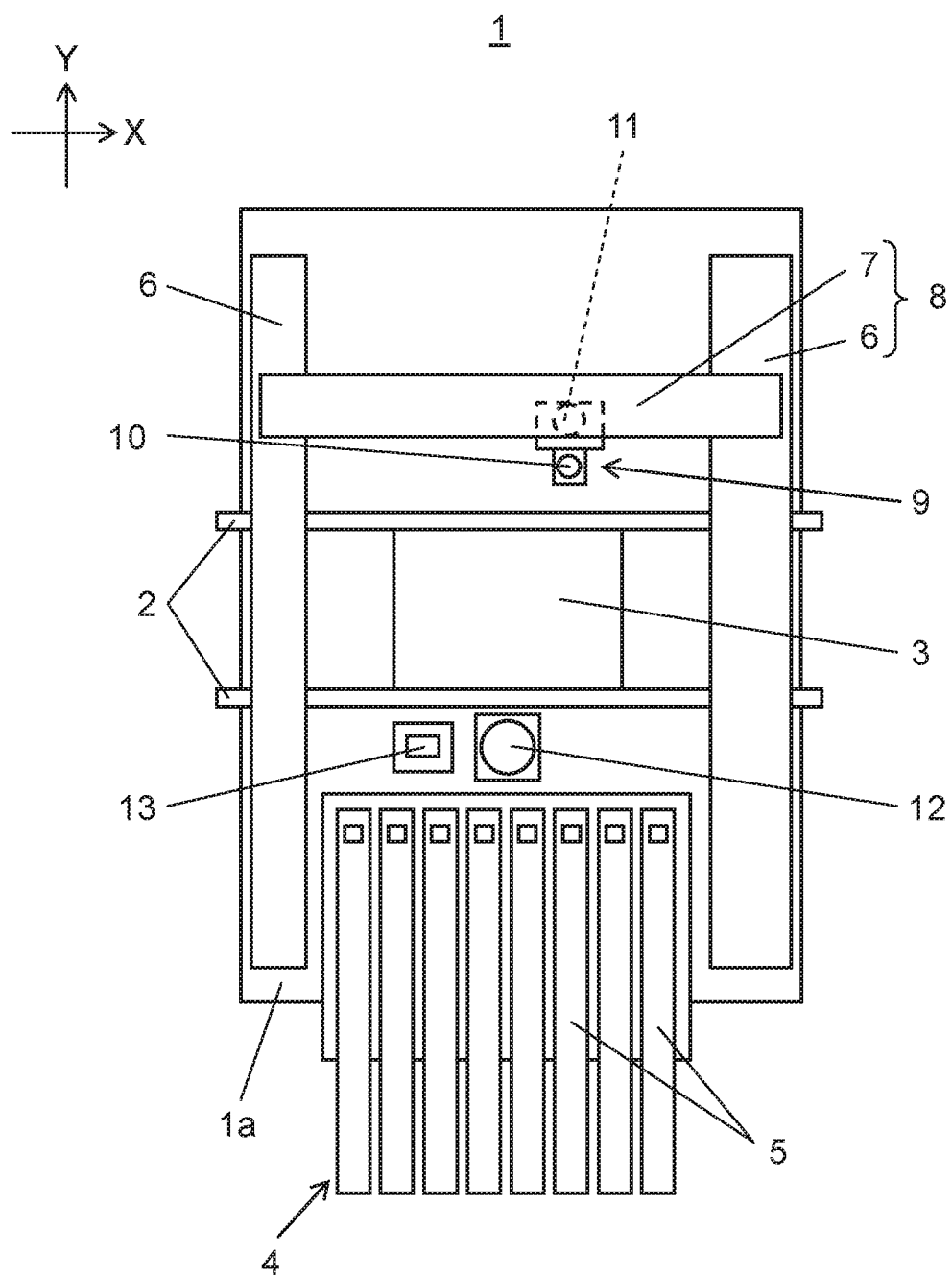
FIG. 1 is a plan view of a light emitting component mounter according to an exemplary embodiment of the present disclosure.

Exemplary embodiments of the present disclosure will be described below with reference to the drawings. First, the configuration of light emitting component mounter 1 will be described with reference to FIG. 1. Light emitting component mounter 1 is provided to hold a light emitting component having a light emitter using a LED or the like as a light source, on a mounting head and to mount the light emitting component onto a board. In FIG. 1, board transporter 2 is provided on an upper surface of base 1a in an X direction (board transfer direction). Board transporter 2 transfers board 3 transferred from an upstream side apparatus and positions and holds board 3 at a mounting operation position by mounting head 9 described below.

Component supplier 4 that supplies light emitting components 20 (see FIG. 2) to be mounted on board 3 is arranged on one side of board transporter 2. A plurality of tape feeders 5 are disposed side by side in component supplier 4. Tape feeders 5 pitch feed carrier tapes accommodating light emitting components 20 to supply light emitting component 20 to component pick-up position of mounting head 9.

Y-axis moving mechanism 6 is erected on both ends of upper surface of base 1a in a Y direction and X-axis moving mechanism 7 is installed movably in Y-axis moving mechanism 6 in the Y direction. Mounting head 9 having nozzle unit 10 is mounted movably on X-axis moving mechanism 7 in the X direction. Board recognition camera 11 that moves integrally with mounting head 9 is disposed on a lower surface of X-axis moving mechanism 7. Mounting head 9 is movable to any position above tape feeder 5 and board 3 together with board recognition camera 11 by driving of Y-axis moving mechanism 6 and X-axis moving mechanism 7. Y-axis moving mechanism 6 and X-axis moving mechanism 7 include head moving mechanism 8 for moving mounting head 9.

As mounting head 9 moves to the upper side of board 3, recognition target such as board recognition mark 3c (see FIG. 5A) set on upper surface of board 3 is captured with board recognition camera 11. Further, as mounting head 9 moves to the upper side of component supplier 4, light emitting components 20 may be taken out from tape feeders 5. As a result, a component mounting operation is performed, in which light emitting component 20 is mounted on board 3 positioned and held on board transporter 2. Component recognition camera 12 and measurement stage 13 are disposed between board transporter 2 and component supplier 4. In the present exemplary embodiment, light emitting component 20 taken out from component supplier 4 by mounting head 9 is initially placed on measurement stage 13. When light emitting component 20 is energized by measurement stage 13 to emit light, luminance distribution of light emitter of light emitting component 20 is measured by capturing upper surface of light emitting component 20 with board recognition camera 11 moved to the upper side of measurement stage 13. Board recognition camera 11 is a first image capture that captures light emitting component 20 from above.

Mounting head 9 moves to the upper side of component recognition camera 12 during a movement process of moving mounting head 9 holding light emitting component 20 to board 3 after measuring the luminance distribution. Component recognition camera 12 is a second image capture that captures light emitting component 20 held by mounting head 9 from below. In an operation in which light emitting component 20 is mounted on board 3 by mounting head 9, light emitting component 20 and board 3 are aligned based on a result of recognizing a capturing result of board 3 by board recognition camera 11 and a capturing result of light emitting component 20 by component recognition camera 12.

Figure 2:
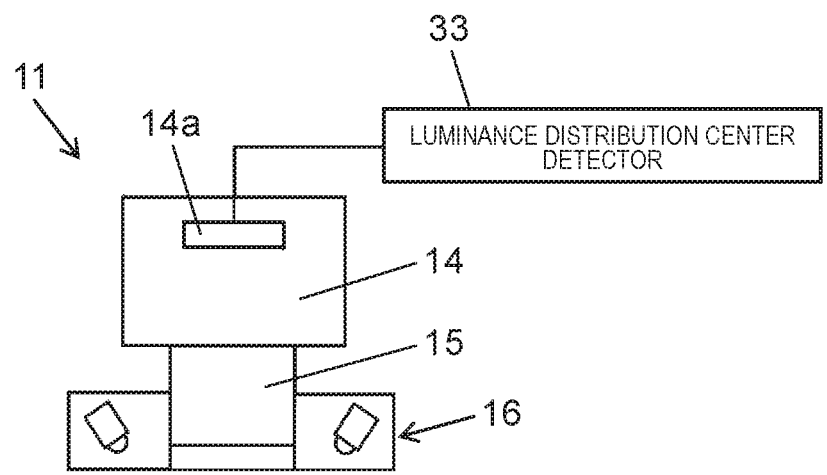
FIG. 2 is a view for explaining a configuration of a measurement stage used for measuring luminance distribution of a light emitting component in a light emitting component mounter according to an exemplary embodiment of the present disclosure.
Figure 2:
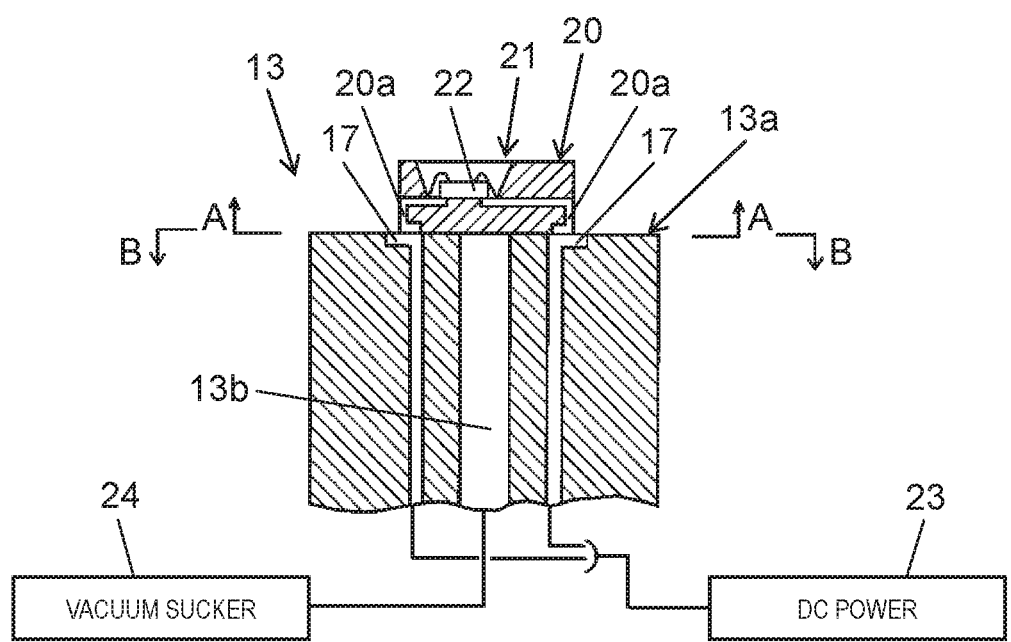
Figure 3A:
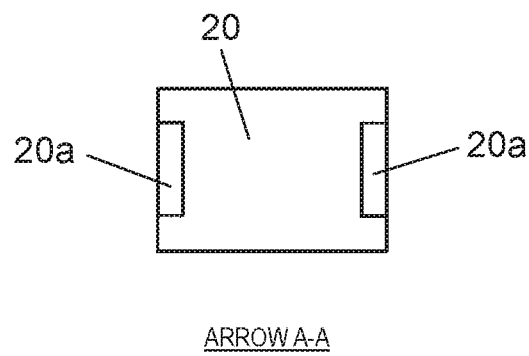
FIG. 3A is a plan view of a lower surface of a light emitting component in a light emitting component mounter according to an exemplary embodiment of the present disclosure.
Figure 3B:
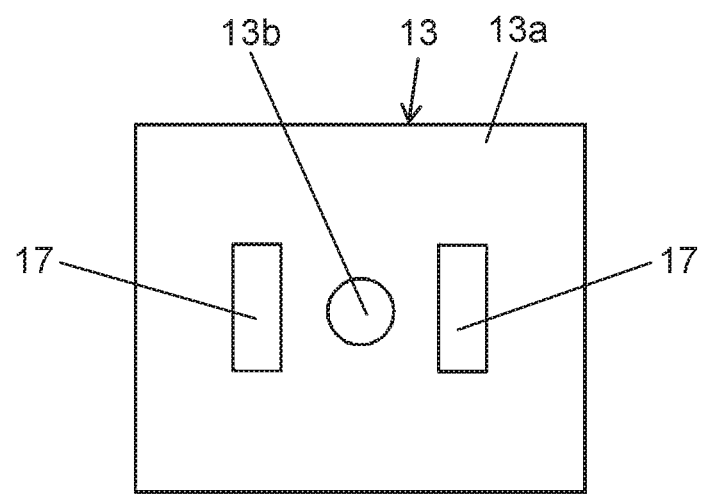
FIG. 3B is a plan view of an upper surface of a measurement stage in a light emitting component mounter according to an exemplary embodiment of the present disclosure.

The measuring a luminance distribution of light emitting component 20 with board recognition camera 11 as the first capture will be described with reference to FIGS. 2, 3A, and 3B. FIG. 2 shows a state in which light emitting component 20 to be measured is placed on placement surface 13a of measurement stage 13 and board recognition camera 11 is positioned thereabove. FIGS. 3A and 3B show the views taken along arrows A-A and B-B in FIG. 2, respectively.

Light emitting component 20 is a rectangular component having a flat bottom surface and includes a light emitter 21 having a structure in which LED 22 is covered with a fluorescent resin (not shown). As shown in FIG. 3A, electrodes 20a for energizing LED 22 is provided at both ends of the bottom surface of light emitting component 20. As shown in FIG. 3B, a pair of energizing terminals 17 is provided corresponding to electrodes 20a of light emitting component 20 on placement surface 13a of measurement stage 13. Energizing terminals 17 are connected to positive electrode side and negative electrode side of DC power supplier 23, respectively.

Figure 6:
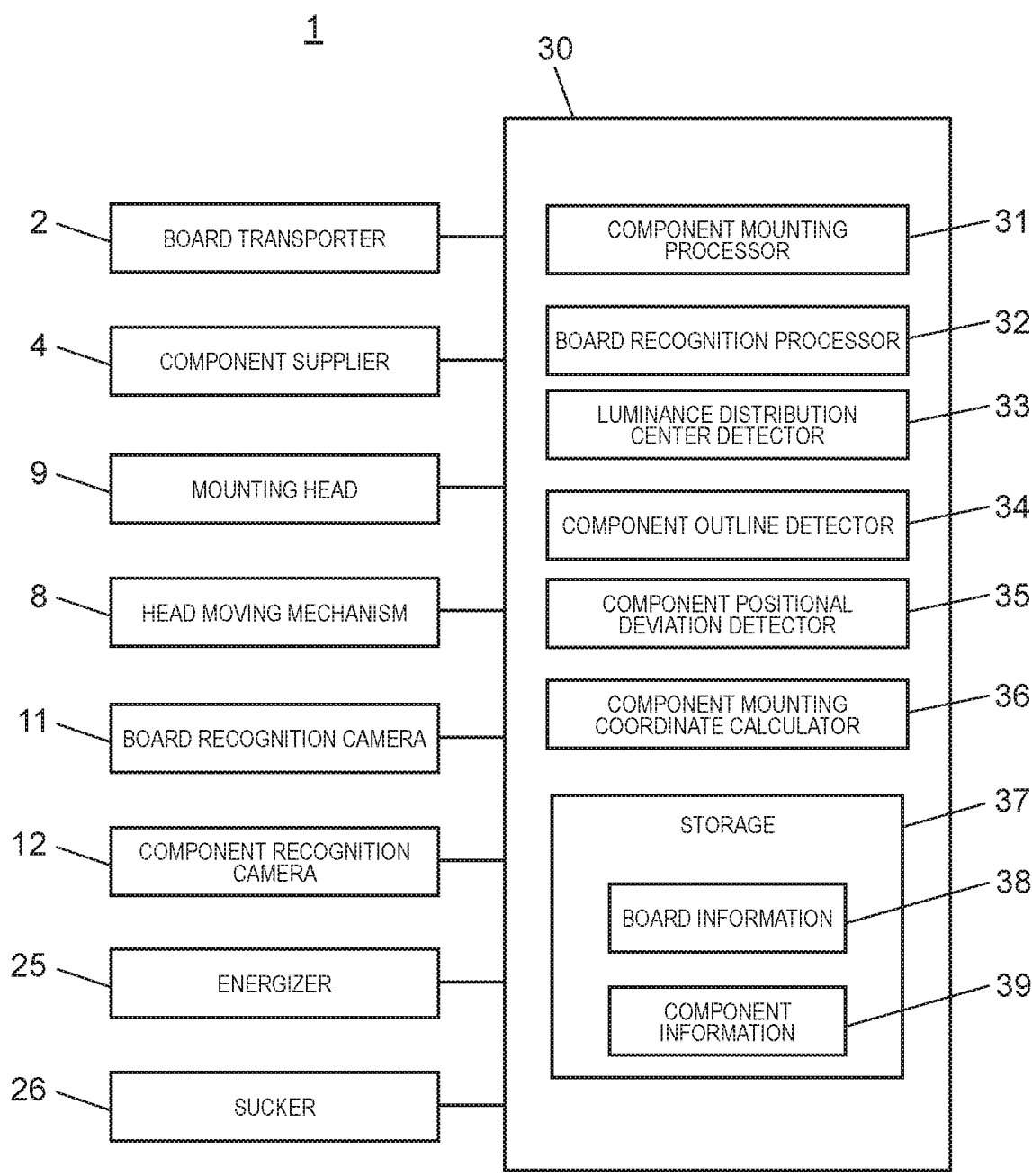
FIG. 6 is a block diagram showing a configuration of a control system of a light emitting component mounter according to an exemplary embodiment of the present disclosure.

DC power supplier 23 serves as a switch, and is configured to be able to turn ON/OFF the energization of light emitting component 20 through energizing terminals 17 by controlling DC power supplier 23 with controller 30 (see FIG. 6). That is, in energization ON state, DC power is energized to LED 22 from DC power supplier 23 through energization terminals 17 and electrodes 20a, such that LED 22 emits light. Therefore, energizer 25 for energizing light emitting component 20 (see FIG. 6) includes DC power supplier 23, measurement stage 13 on which light emitting component 20 is placed, and energizing terminals 17 formed on placement surface 13a of measurement stage 13.

Further, measurement stage 13 includes suction hole 13b for holding light emitting component 20 by vacuum suction provided as an opening in placement surface 13a. Suction hole 13b is connected to vacuum sucker 24. Vacuum sucker 24 has an ON/OFF control function, and controller 30 (see FIG. 6) may control vacuum sucker 24 so that vacuum suction is performed through suction hole 13b.

As a result, light emitting component 20 can be held on placement surface 13a by the vacuum suction at a desired timing. Therefore, suction hole 13b and vacuum sucker 24 are sucker 26 (see FIG. 6) for sucking light emitting component 20 on measurement stage 13. For sucker 26, electrostatic suction or any means other than vacuum suction may be used to suck and hold light emitting component 20.

While light emitting component 20 is sucked onto placement surface 13a of measurement stage 13 and LED 22 is energized to emit light, the luminance distribution of light emitting component 20 is measured by capturing light emitting component 20 from above with board recognition camera 11. Board recognition camera 11 has a configuration in which optical system 15 is attached to a lower portion of camera main body 14 incorporating capturing device 14a such as a CMOS device.

In the present exemplary embodiment, while LED 22 is energized to emit light, capturing device 14a receives the light from light emitter 21 and captures an image. A center of luminance distribution of the light from light emitter 21 is detected by processing the captured result with luminance distribution center detector 33. An annular illuminator 16 may be mounted around optical system 15 to irradiate captured target with illumination light depending on the captured target. In the present exemplary embodiment, illuminator 16 is operated at the time of capturing for detecting an outline of a component described below.

Figure 4A:
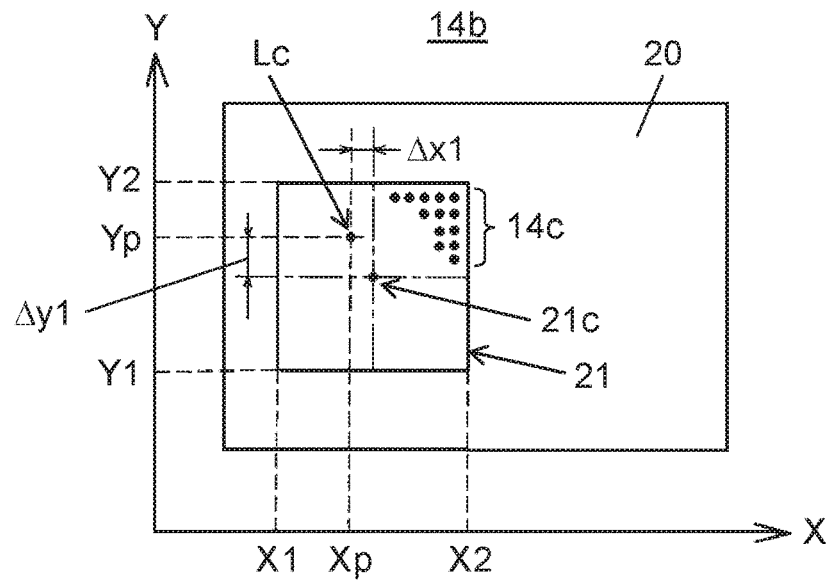
FIG. 4A is a view for explaining detection of a center of luminance distribution of a light emitting component in a light emitting component mounter according to an exemplary embodiment of the present disclosure.

Next, an example of luminance distribution center detection according to the present exemplary embodiment will be described with reference to FIGS. 4A, 4B, and 4C. FIG. 4A shows image screen 14b obtained by capturing device 14a receiving the light from light emitter 21. In FIG. 4A, X1, X2, Y1, and Y2 are coordinate values indicating the outline position of light emitter 21. Luminance point 14c of which the luminance is obtained by receiving light with each light receiving element constituting capturing device 14a is distributed in the capture area corresponding to light emitter 21 on image screen 14b. Luminance points 14c show different luminance values according to the light emitting state of light emitter 21. Here, luminance point 14c indicated by the coordinates (Xp, Yp) corresponds to the luminance peak position having the highest luminance value.

Figure 4B:
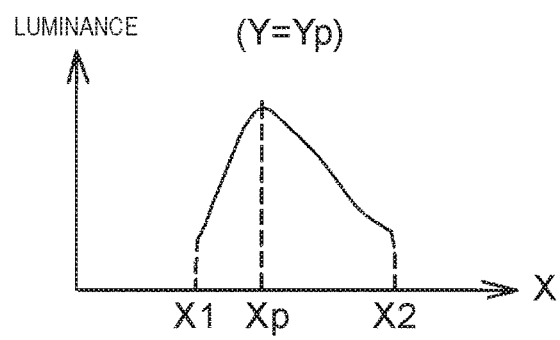
FIG. 4B is a view for explaining detection of a center of luminance distribution of a light emitting component in a light emitting component mounter according to an exemplary embodiment of the present disclosure.
Figure 4C:
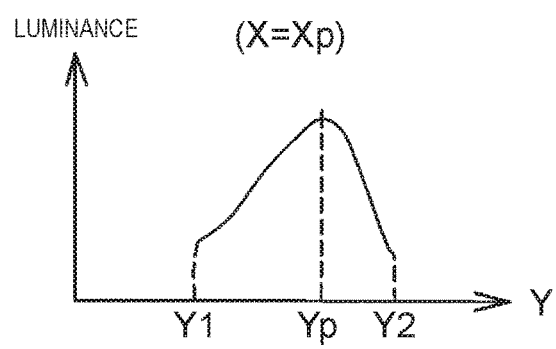
FIG. 4C is a view for explaining detection of a center of luminance distribution of a light emitting component in a light emitting component mounter according to an exemplary embodiment of the present disclosure.

FIG. 4B shows the luminance distribution in the X direction in the cross section of Y=Yp, and FIG. 4C shows the luminance distribution in the Y direction in the cross section of X=Xp in the same manner. As shown by these luminance distributions, the luminance value is the highest at the coordinates (Xp, Yp). In the present exemplary embodiment, the luminance peak position indicated by the coordinates (Xp, Yp) is regarded as luminance distribution center Lc in light emitter 21. The position of luminance distribution center Lc is specified by Δx1 and Δy1 which are offset values from light emitter center 21c. Then, when aligning based on the position of luminance distribution center Lc, these offset values are used as position correction data.

It should be noted that the pattern of the luminance distribution in light emitter 21 is various and does not necessarily have a clear peak capable of uniquely determining the luminance distribution center as shown here. For example, there are a pattern having a plurality of peaks, a trapezoidal pattern having no peak, and the like. In such a case, the luminance distribution center is determined based on the three-dimensional luminance curved surface constituted of luminance values at each point of luminance point 14c. For example, the position of the center of gravity of a three-dimensional body wrapped by a luminance curved surface is obtained, and the luminance distribution center is set based on the plane coordinates of the position of the center of gravity.

Figure 5A:
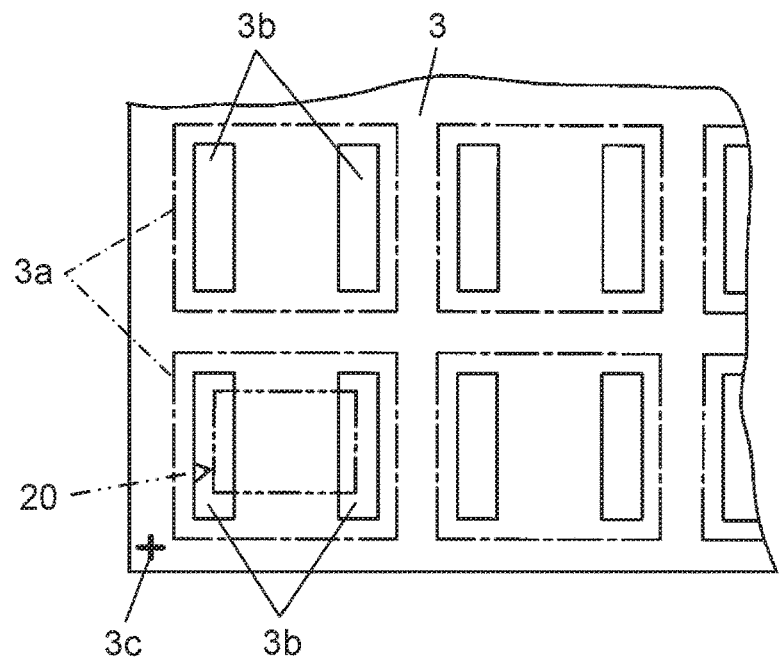
FIG. 5A is a view for explaining alignment of light emitting components in a light emitting component mounter according to an exemplary embodiment of the present disclosure.

Next, the configuration of board 3 and the alignment of light emitting component 20 on board 3 will be described. As shown in FIG. 5A, board recognition mark 3c for position recognition and plurality of component mounting positions 3a on which light emitting components 20 are mounted are set on board 3. A pair of lands 3b are formed at each component mounting position 3a, and electrodes 20a of light emitting components 20 are bonded to lands 3b.

Figure 5B:
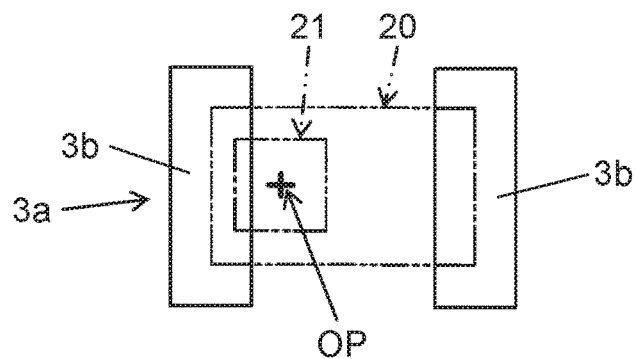
FIG. 5B is a view for explaining alignment of light emitting components in a light emitting component mounter according to an exemplary embodiment of the present disclosure.

As shown in FIG. 5B, an optical axis reference point OP, which corresponds to the optical axis position of the light condensing element mounted so as to cover light emitting component 20, is set at each component mounting position 3a. In the ideal state, the optical axis reference point OP is set corresponding to luminance distribution center Lc of light emitter 21, that is, to the center position of light emitter 21. The optical axis reference point OP has a meaning as a reference mounting position, which indicates the mounting position of light emitting component 20 in the normal state at each component mounting position 3a.

As described with reference to FIGS. 4A, 4B, and 4C, the position of luminance distribution center Lc of the actual light emitting component 20 varies and does not necessarily coincide with the center position of light emitter 21. Therefore, in the present exemplary embodiment, light emitting component 20 is aligned relative to board 3 such that luminance distribution center Lc detected for light emitting component 20 mounted at component mounting position 3a coincides with the optical axis reference point OP. As a result, the illumination light from light emitter 21 can be efficiently irradiated on the condensing element. Next, the configuration of a control system of light emitting component mounter 1 will be described with reference to FIG. 6. Controller 30 is an arithmetic processor having a storage. In light emitting component mounter 1, controller 30 includes, as internal processing functions, component mounting processor 31, board recognition processor 32, luminance distribution center detector 33, component outline detector 34, component positional deviation detector 35, and component mounting coordinate calculator 36.

Further, controller 30 includes an embedded storage 37 for storing board information 38 and component information 39. Board information 38 and component information 39 are design information about board 3 and light emitting part 20 to be mounted, respectively, and this information indicates lands 3b of board 3, position coordinates of optical axis reference point OP, positional relationship between optical axis reference point OP and board recognition mark 3c, shape of light emitting component 20, and the like. In addition, controller 30 is connected to board transporter 2, component supplier 4, mounting head 9, head moving mechanism 8, board recognition camera 11, component recognition camera 12, energizer 25 and sucker 26.

Component mounting processor 31 controls board transporter 2, component supplier 4, mounting head 9, and head moving mechanism 8 to pick up light emitting component 20 from component supplier 4 and mount light emitting component 20 on board 3. This component mounting is performed with reference to the component mounting coordinate calculation result performed by component mounting coordinate calculator 36 described below.

Board recognition processor 32 recognizes the captured result obtained by capturing board recognition mark 3c (see FIG. 5A) formed on board 3 with board recognition camera 11, so that the position of the optical axis reference point OP (see FIG. 5B) of light emitting component 20 on board 3 is detected. Luminance distribution center detector 33 recognizes the captured result obtained with board recognition camera 11 which is the first capture, to obtain the position of luminance distribution center Lc (see FIG. 4A).

In the present exemplary embodiment, energizer 25 that energizes light emitting component 20, and board recognition camera 11 as the first capture for capturing light emitting component 20 from above are provided, and luminance distribution center detector 33 described above is provided as a luminance distribution measurer that causes light emitter 21 to emit light, measures the luminance distribution of light emitter 21 and detects the position of luminance distribution center Lc in light emitter 21 from the measured result. In the component mounting at component mounting processor 31 included in controller 30, head moving mechanism 8 is controlled based on the position of luminance distribution center Lc detected by the luminance distribution measurer.

Component outline detector 34 recognizes the recognized result obtained with board recognition camera 11 (the first capture), to detect the outline of light emitting component 20. In the component mounting at component mounting processor 31 included in controller 30, head moving mechanism 8 is controlled in consideration of a detection result of component outline detector 34.

Component positional deviation detector 35 recognizes a captured result obtained with component recognition camera 12 (the second capture) that captures light emitting component 20 held by mounting head 9 from below to detect the positional deviation of mounting head 9 of light emitting component 20. In the component mounting at component mounting processor 31 included in controller 30, head moving mechanism 8 is controlled in consideration of a detection result of component positional deviation detector 35.

Component mounting coordinate calculator 36 calculates so that luminance distribution center Lc of light emitting component 20 held by mounting head 9 is aligned with the optical axis reference point OP on board 3 based on the recognized results obtained with board recognition processor 32, luminance distribution center detector 33, and component outline detector 34. Then, component mounting processor 31 controls head moving mechanism 8 based on the calculated component mounting coordinates so that suction nozzle 10a (see FIG. 9A) of mounting head 9 holding light emitting component 20 is moved relative to board 3. Then, luminance distribution center Lc of light emitter 21 is aligned with optical axis reference point OP of component mounting position 3a of board 3.

Next, the component mounting operation of the light emitting component mounting method, of holding light emitting component 20 provided with light emitter 21 with mounting head 9 and mounting the same on board 3 will be described in accordance with the flow of FIG. 7. In this drawing, the operations (shown in left-hand side) performed by mounting head 9 and the processes (shown in right-hand side) at measurement stage 13 are shown in parallel. First, component suction by mounting head 9 is performed (ST1).

That is, light emitting component 20 is sucked and picked up from component supplier 4 by mounting head 9.

Next, component recognition for placing light emitting component 20 on measurement stage 13 is performed (ST2).

Figure 9A:
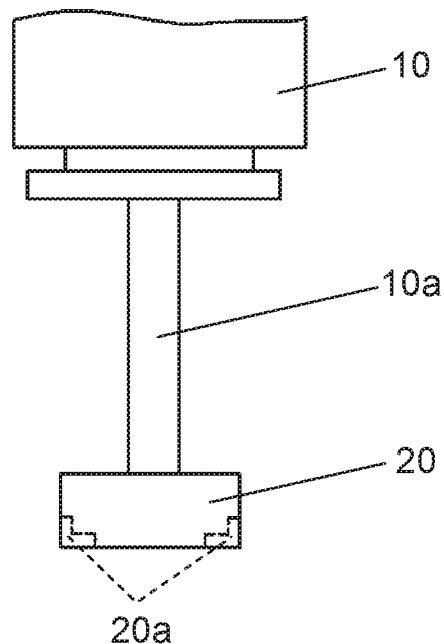
FIG. 9A is a view for explaining how a light emitting component and a measurement stage are aligned with each other with a light emitting component mounting method according to an exemplary embodiment of the present disclosure.
Figure 9A:

That is, as shown in FIG. 9A, nozzle unit 10, which sucked light emitting component 20 at the lower end of suction nozzle 10a thereof, is moved to the upper side of component recognition camera 12. Then, light emitting component 20 in this state is captured from the lower surface side with component recognition camera 12 so that electrodes 20a on the lower surface of light emitting component 20 are recognized.

Figure 9B:
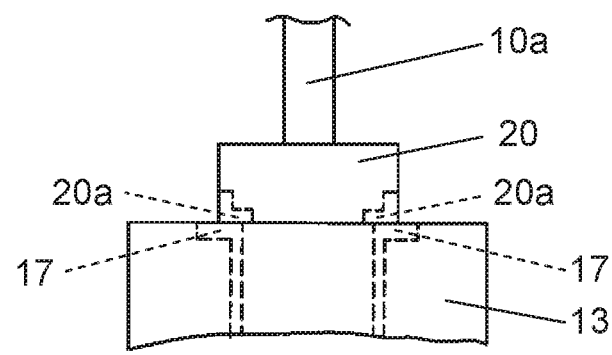
FIG. 9B is a view for explaining how a light emitting component and a measurement stage are aligned with each other with a light emitting component mounting method according to an exemplary embodiment of the present disclosure.

Next, mounting head 9 holding light emitting component 20 with suction nozzle 10a is moved to the placement position (ST3). That is, mounting head 9 is positioned above measurement stage 13, and suction nozzle 10a is lowered (ST4). As a result, as shown in FIG. 9B, light emitting component 20 is placed on the upper surface of measurement stage 13, and electrodes 20a abut on energizing terminal 17 of measurement stage 13.

Then, component suction is turned on at measurement stage 13 (ST5). That is, vacuum suction is performed through suction hole 13b to hold light emitting component 20 on placement surface 13a. Then the suction of light emitting component 20 by suction nozzle 10a is turned off (ST6), and then suction nozzle 10a is raised. As a result, the upper side of measurement stage 13 on which light emitting component 20 is placed is in a free state.

Subsequently, board recognition camera 11 is moved to the measurement position above measurement stage 13 (ST7). In addition, in measurement stage 13, energizer 25 is operated to turn ON energizing of light emitting component 20 (ST8). As a result, light emitter 21 of light emitting component 20 to be measured emits light.

Then, the luminance distribution of light emitter 21 is measured by capturing light emitting component 20 with board recognition camera 11 (ST9). Next, luminance distribution center Lc (the position of luminance distribution center Lc shown in FIG. 4A) is detected based on the measured result of the luminance distribution (ST10). That is, in this operation, light emitter 21 emits light to measure the luminance distribution of light emitter 21, and the position of luminance distribution center Lc in light emitter 21 is detected from the measured result (luminance distribution measuring step).

After this, the energizing of light emitting component 20 is turned off at measurement stage 13 (ST11), and mounting head 9 is moved to the pick-up position above measurement stage 13 (ST12). Then, suction nozzle 10a is lowered (ST13), and component suction by suction nozzle 10a is turned ON (ST14). Next, the component suction is turned off in measurement stage 13 (ST15). As a result, light emitting component 20 in measurement stage 13 is released from held state, and light emitting component 20 can be picked up by mounting head 9.

Figure 5C:
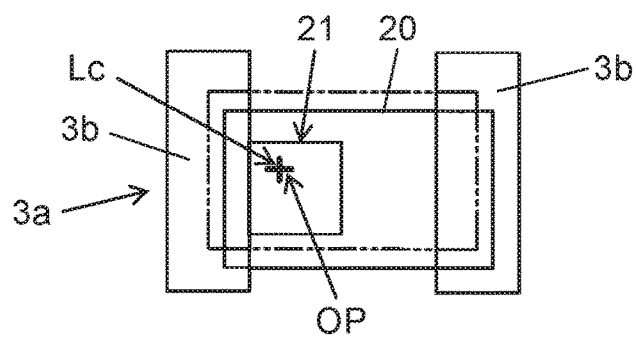
FIG. 5C is a view for explaining alignment of light emitting components in a light emitting component mounter according to an exemplary embodiment of the present disclosure.

Then mounting head 9 holding light emitting component 20 is moved to the upper side of board 3 (head moving step), and component mounting is performed (ST16). In this head moving step, mounting head 9 is moved based on the position of luminance distribution center Lc detected in the luminance distribution measuring step. That is, as shown in FIG. 5C, light emitting component 20 is aligned with board 3 so that luminance distribution center Lc coincides with optical axis reference point OP.

Figure 7:
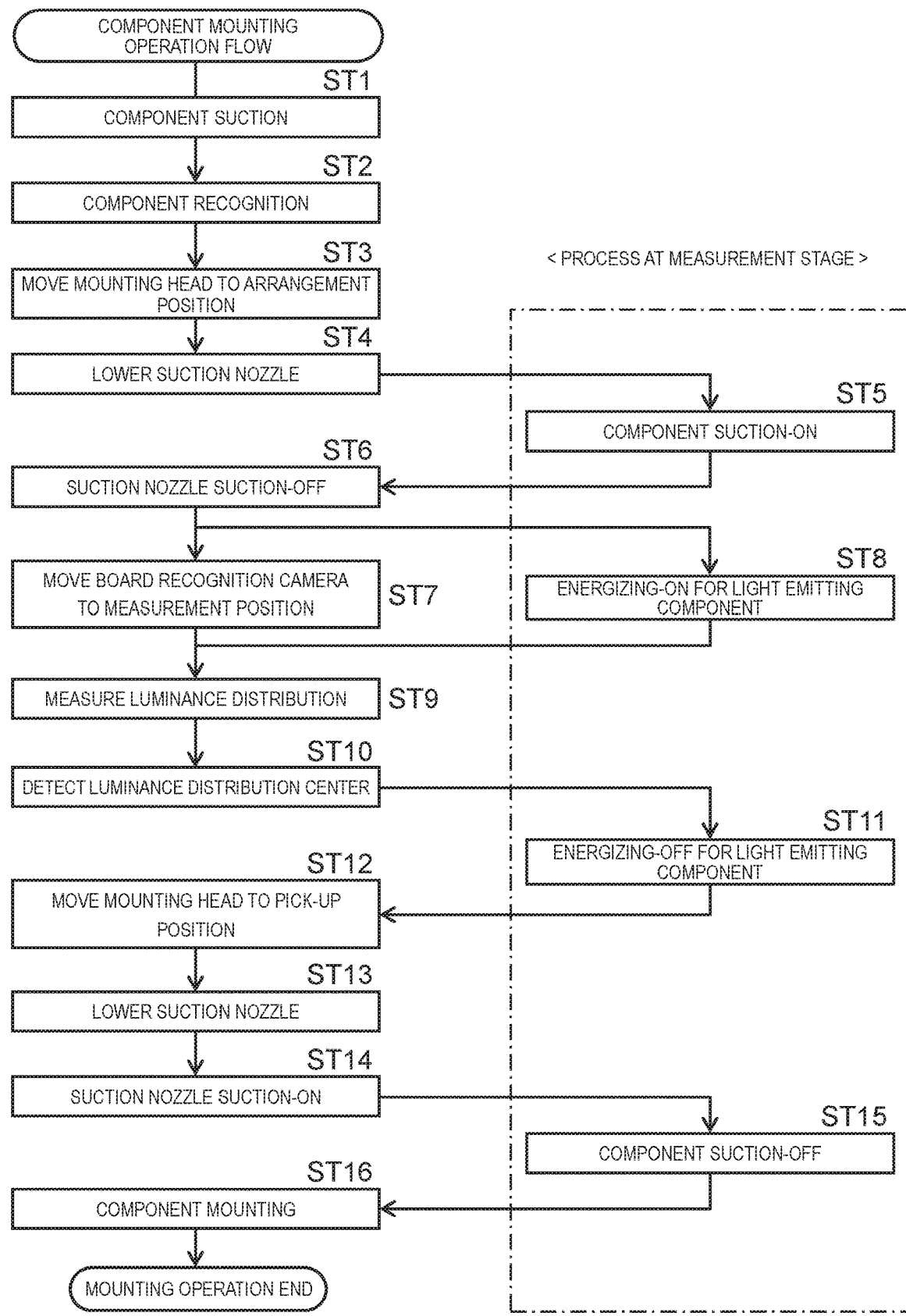
FIG. 7 is a flowchart showing component mounting operation of a light emitting component mounting method according to an exemplary embodiment of the present disclosure.
Figure 8A:
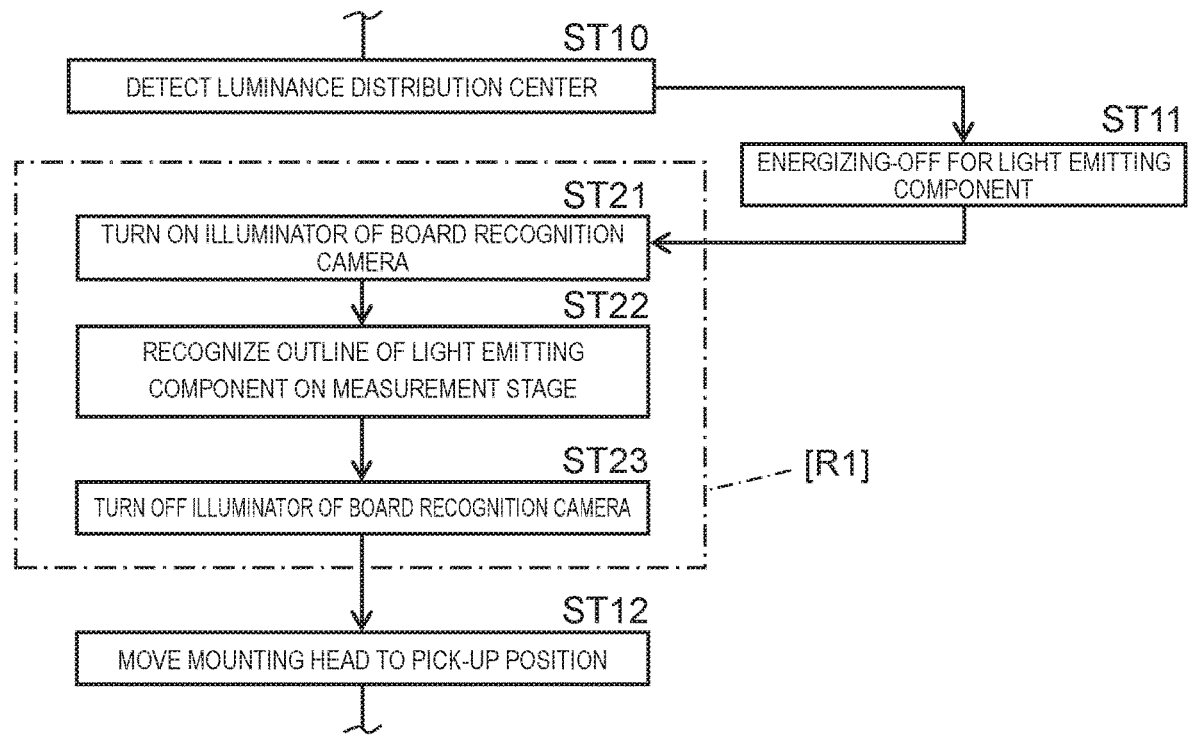
FIG. 8A is a flowchart showing a component mounting operation of a light emitting component mounting method according to an exemplary embodiment of the present disclosure.
Figure 8B:
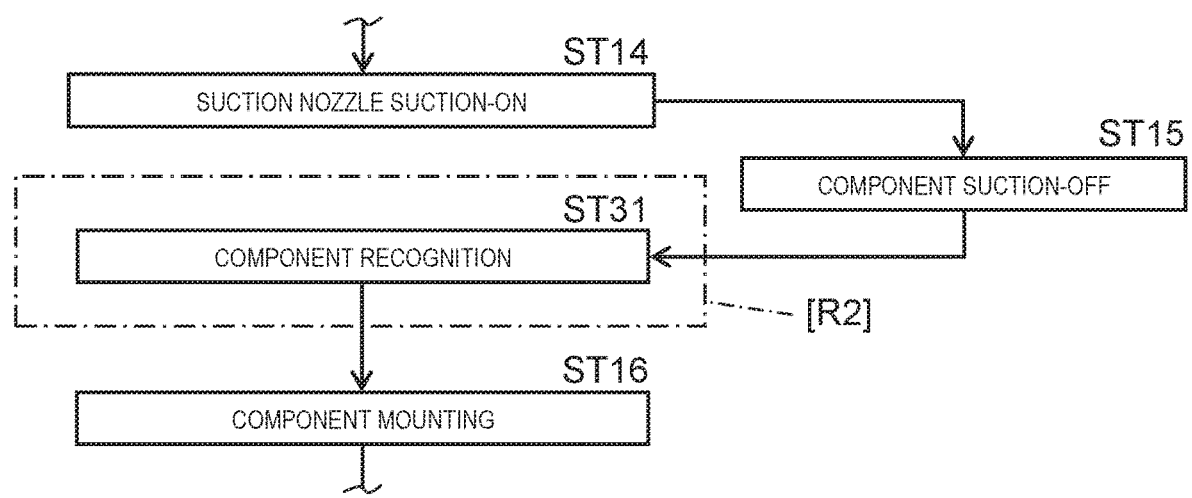
FIG. 8B is a flowchart showing a component mounting operation of a light emitting component mounting method according to an exemplary embodiment of the present disclosure.

The flow of the component mounting operation shown in FIG. 7 represents the basic operation, and to this basic operation, the first additional recognition step [R1] shown in FIG. 8A and the second additional recognition step [R2] shown in FIG. 8B may be added.

The first additional recognition step [R1] will be described. In FIG. 8A, the energizing of light emitting component 20 is turned off (ST11) in measurement stage 13, and then illuminator 16 (see FIG. 2) of board recognition camera 11 is turned ON (ST21). Next, the outline of light emitting component 20 on measurement stage 13 is recognized (ST22). That is, board recognition camera 11 captures light emitting component 20 and component outline detector 34 recognizes the captured result so that the outline of light emitting component 20 is detected. Then illuminator 16 of board recognition camera 11 is turned off (ST23), and first additional recognition step [R1] ends.

Then, the flow shifts to (ST12) and returns to the flow shown in FIG. 7. In the component mounting (ST16), component mounting processor 31 included in controller 30 controls head moving mechanism 8 in consideration of the detection result of component outline detector 34 to move mounting head 9 holding light emitting component 20 to align light emitting component 20.

That is, first, the component center (outline center) based on the outline of light emitting component 20 is obtained from the detection result of the outline. Then, a positional deviation (positional deviation of the outline) of the center of the outline with respect to the normal component center is obtained, and light emitting component 20 is aligned with respect to board 3 in consideration of the outline positional deviation of the outline. With the addition of this positional deviation of the outline, it is possible to suppress the occurrence of interference with adjacent components in narrow adjacent mounting in which a plurality of light emitting components 20 are mounted at a narrow interval.

However, in this case, it is inevitable that the alignment accuracy is lowered when aligning luminance distribution center Lc correctly to optical axis reference point OP. Therefore, it is necessary to determine the alignment state of light emitting component 20 in consideration of a trade-off between prevention of problem due to interference with an adjacent component and effect of aligning luminance distribution center Lc with the optical axis reference point OP.

The second additional recognition step [R2] will be described. In FIG. 8B, the component suction is turned off (ST15) in measurement stage 13, and then suction nozzle 10a holding light emitting component 20 is moved to the upper side of component recognition camera 12. Next, component recognition of light emitting component 20 is performed (ST31). That is, light emitting component 20 sucked and held by suction nozzle 10a is captured from below with component recognition camera 12 (similar to the example shown in FIG. 9A), and component positional deviation detector 35 recognizes this captured result so that the positional deviation in mounting head 9 of light emitting component 20 is detected. As a result, the second additional recognition step [R2] ends.

After this, the flow moves to (ST16) and returns to the flow shown in FIG. 7. In the component mounting (ST16), component mounting processor 31 included in controller 30 controls head moving mechanism 8 in consideration of the detection result of component positional deviation detector 35. That is, component positional deviation detector 35 recognizes the captured result obtained by capturing light emitting component 20 held by mounting head 9 from below to detect the positional deviation of light emitting component 20 with respect to mounting head 9.

As a result, it is possible to detect the positional deviation of light emitting component 20 generated by turning off the component suction at measurement stage 13 (ST15). Then, in the component mounting at component mounting processor 31 included in controller 30, head moving mechanism 8 is controlled in consideration of the positional deviation described above so that the positional deviation described above is corrected and light emitting component 20 is aligned with board 3.

As described above, according to the light emitting device mounter and the light emitting device mounting method described in this exemplary embodiment, in the light emitting component mounting in which light emitting component 20 provided with light emitter 21 is held by mounting head 9 and mounted on board 3, light emitter 21 emits light and the luminance distribution of light emitter 21 is measured. From the measured result, luminance distribution is measured for detecting the position of luminance distribution center Lc in light emitter 21. Then, when mounting head 9 is moved by head moving mechanism 8, head moving mechanism 8 is controlled based on the detected position of luminance distribution center Lc. As a result, it is possible to correctly detect luminance distribution center Lc, which is the light emitting center of light emitting component 20, and to align luminance distribution center Lc on board 3.

The light emitting component mounter and the light emitting component mounting method according to the present disclosure have the effect that the light emitting center of the light emitting component can be correctly detected and aligned on the board, and are useful in the field of manufacturing the illumination board by mounting the light emitting element such as an LED on a board.

What is claimed is:

1. A light emitting component aligning method for holding a light emitting component provided with a light emitter by a mounting head and aligning the light emitting component at a component mounting position on a board, the method comprising:
  energizing the light emitter to emit a light with an energizer;
  measuring a luminance distribution of the light emitter with a camera;
  detecting with a luminance distribution center detector a position of a luminance distribution center having a highest luminance value in the light emitter based on the luminance distribution measured in the measuring, the position of the luminance distribution center being specified by offset values from a center of the light emitter; and
  moving the mounting head that holds the light emitting component with a head moving mechanism to align the light emitting component relative to the board, using the offset values as position correction data, such that the luminance distribution center coincides with a reference point set at the component mounting position.

* * * * *